United States Patent
Yatskov (10) Patent No.: US 7,193,851 B2
(45) Date of Patent: Mar. 20, 2007

(54) ASSEMBLIES FOR HOLDING HEAT SINKS AND OTHER STRUCTURES IN CONTACT WITH ELECTRONIC DEVICES AND OTHER APPARATUSES

(75) Inventor: Alexander I. Yatskov, Seattle, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 11/298,298

(22) Filed: Dec. 9, 2005

(65) Prior Publication Data

US 2006/0146500 A1    Jul. 6, 2006

Related U.S. Application Data

(60) Provisional application No. 60/634,490, filed on Dec. 9, 2004.

(51) Int. Cl.
    *H05K 7/20*    (2006.01)
(52) U.S. Cl. .................. 361/710; 361/704; 165/80.3; 257/718
(58) Field of Classification Search ............. 361/688, 361/690, 704, 710, 715; 165/80.2–80.3, 165/185; 257/718–719
    See application file for complete search history.

(56) References Cited

U.S. PATENT DOCUMENTS

| | | | |
|---|---|---|---|
| 2,673,721 A * | 3/1954 | Dickinson .................. | 165/80.3 |
| 2,861,782 A * | 11/1958 | Swartz ....................... | 165/80.3 |
| 3,317,798 A | 5/1967 | Chu et al. | |
| 4,315,300 A | 2/1982 | Parmerlee et al. | |
| 4,993,482 A * | 2/1991 | Dolbear et al. ............ | 165/80.2 |
| 5,035,628 A | 7/1991 | Casciotti et al. | |
| 5,060,716 A * | 10/1991 | Heine .......................... | 165/47 |
| 5,150,277 A | 9/1992 | Bainbridge et al. | |
| 5,161,087 A | 11/1992 | Frankeny et al. | |
| 5,273,438 A | 12/1993 | Bradley et al. | |
| 5,329,425 A | 7/1994 | Leyssens et al. | |
| 5,365,402 A * | 11/1994 | Hatada et al. .............. | 361/699 |
| 5,376,008 A | 12/1994 | Rodriguez | |
| 5,395,251 A | 3/1995 | Rodriguez et al. | |
| 5,402,313 A | 3/1995 | Casperson et al. | |
| 5,410,448 A | 4/1995 | Barker, III et al. | |
| 5,685,363 A * | 11/1997 | Orihira et al. ............... | 165/46 |
| 6,046,908 A | 4/2000 | Feng | |
| 6,115,242 A | 9/2000 | Lambrecht | |
| 6,158,502 A | 12/2000 | Thomas | |
| 6,167,948 B1 | 1/2001 | Thomas | |

(Continued)

OTHER PUBLICATIONS

Baer, D.B., "Emerging Cooling Requirements & Systems in Telecommunications Spaces," Telecommunications Energy Conference 2001, Oct. 14-18, 2001, pp. 95-100.

(Continued)

*Primary Examiner*—Michael Datskovsky
*Assistant Examiner*—Robert J. Hoffberg
(74) *Attorney, Agent, or Firm*—Perkins Coie LLP (57) ABSTRACT

Structures and methods for holding heat sinks in contact with electronic devices are described herein. In one embodiment, an assembly for holding a heat sink in contact with an electronic device includes a coil spring in transverse compression. When transversely compressed, the coil spring presses the heat sink against the electronic device with a uniform, or at least approximately uniform, pressure that enables the heat sink to efficiently conduct heat away from the electronic device without damaging the device.

29 Claims, 11 Drawing Sheets

U.S. PATENT DOCUMENTS

| | | | |
|---|---|---|---|
| 6,310,773 | B1 | 10/2001 | Yusuf et al. |
| 6,332,946 | B1 | 12/2001 | Emmett et al. |
| 6,416,330 | B1 | 7/2002 | Yatskov |
| 6,435,266 | B1 | 8/2002 | Wu |
| 6,515,862 | B1 | 2/2003 | Wong et al. |
| 6,519,955 | B2 | 2/2003 | Marsala |
| 6,550,530 | B1 | 4/2003 | Bilski |
| 6,564,858 | B1 | 5/2003 | Stahl |
| 6,631,078 | B2 * | 10/2003 | Alcoe et al. ............... 361/719 |
| 6,644,384 | B2 | 11/2003 | Stahl |
| 6,679,081 | B2 | 1/2004 | Marsala |
| 6,772,604 | B2 | 8/2004 | Bash et al. |
| 6,992,889 | B1 | 1/2006 | Kashiwagi et al. |
| 6,999,316 | B2 | 2/2006 | Hamman |
| 2001/0052412 | A1 | 12/2001 | Tikka |
| 2004/0250990 | A1 * | 12/2004 | Schaper .................... 165/80.2 |
| 2005/0120737 | A1 | 6/2005 | Borror et al. |
| 2005/0162834 | A1 | 7/2005 | Nishimura |
| 2005/0168945 | A1 | 8/2005 | Coglitore |

OTHER PUBLICATIONS

"Heat Spreaders," Novel Concepts, Inc., http://www.novelconceptsinc.com/heat-spreaders.htm, 2 pages [accessed Jun. 14, 2004].

"Frequently Asked Questions about Heat Pipes," Thermacore International, Inc., http://www.thermacore.com/hpt_faqs.htm, 3 pages [accessed Jun. 14, 2004].

JAMSTEC/Earth Simulator Center, "Processor Node (PN) Cabinet," http://www.es.jamstec.go.jp/esc/eng/Hardware/pnc.html, 1 page [accessed Mar. 5, 2004].

Pitasi, M. "Thermal Management System Using Pumped Liquid R-134a with Two Phase Heat Transfer," Thermal Form & Function LLC, Manchester, MA, http:/www.coolingzone.com/Guest/News/NL_MAR_2002/TFF/Tff.html, pp. 1-9, Mar. 2002.

Hannemann, Robert et al., "Pumped Liquid Multiphase Cooling," ASME, 2004, IMECE 2004, Paper IMECE2004-60669, Anaheim, CA, 5 pages.

"Managing Extreme Heat Cooling Strategies for High-Density Computer Systems," Liebert Corporation, Dec. 7, 2003, Columbus, OH, 16 pages.

"Therma-base™ Heat Sink," Thermacore Thermal Management Solutions, pp. 1-3, accessed Jun. 14, 2005.

Vogel, Martin et al., "Low Profile Heat Sink Cooling Technologies for Next Generation CPU Thermal Designs," Electronic Cooling Online, Feb. 17, 2005, 11 pages.

* cited by examiner

ASSEMBLIES FOR HOLDING HEAT SINKS AND OTHER STRUCTURES IN CONTACT WITH ELECTRONIC DEVICES AND OTHER APPARATUSES

CROSS-REFERENCE TO RELATED APPLICATION(S) INCORPORATED BY REFERENCE

This application claims the benefit of U.S. Provisional Patent Application No. 60/634,490, filed on Dec. 9, 2004, entitled "ASSEMBLIES FOR HOLDING HEAT SINKS AND OTHER STRUCTURES IN CONTACT WITH ELECTRONIC DEVICES AND OTHER APPARATUSES," which is incorporated herein in its entirety by reference.

This application incorporates by reference the entire disclosures of U.S. Non-Provisional patent application Ser. No. 10/886,895, filed on Jul. 8, 2004, entitled "ASSEMBLIES FOR MOUNTING ELECTRONIC DEVICES AND ASSOCIATED HEAT SINKS TO COMPUTER MODULES AND OTHER STRUCTURES," U.S. Non-Provisional patent application Ser. No. 10/886,911, filed on Jul. 8, 2004, entitled "ASSEMBLIES FOR HOLDING HEAT SINKS AND OTHER STRUCTURES IN CONTACT WITH ELECTRONIC DEVICES AND OTHER APPARATUSES," and U.S. Non-Provisional patent application Ser. No. 11/153,847, filed on Jun. 14, 2005, entitled "APPARATUSES AND METHODS FOR COOLING ELECTRONIC DEVICES IN COMPUTER SYSTEMS."

TECHNICAL FIELD

The following disclosure relates generally to heat sinks for electronic devices and, more particularly, to assemblies for holding heat sinks in contact with electronic devices.

BACKGROUND

Supercomputers typically include a large number of computer cabinets arranged in banks. The computer cabinets typically hold a large number of computer modules positioned in close proximity to each other for increased efficiency. Each computer module can include a motherboard that carries a plurality of processors, routers, and other electronic devices for data and/or power transmission. These devices can generate considerable heat during operation that can damage the devices and degrade performance if not dissipated quickly. To dissipate the heat and avoid damage, supercomputers typically include both active and passive cooling systems.

Figure 1:
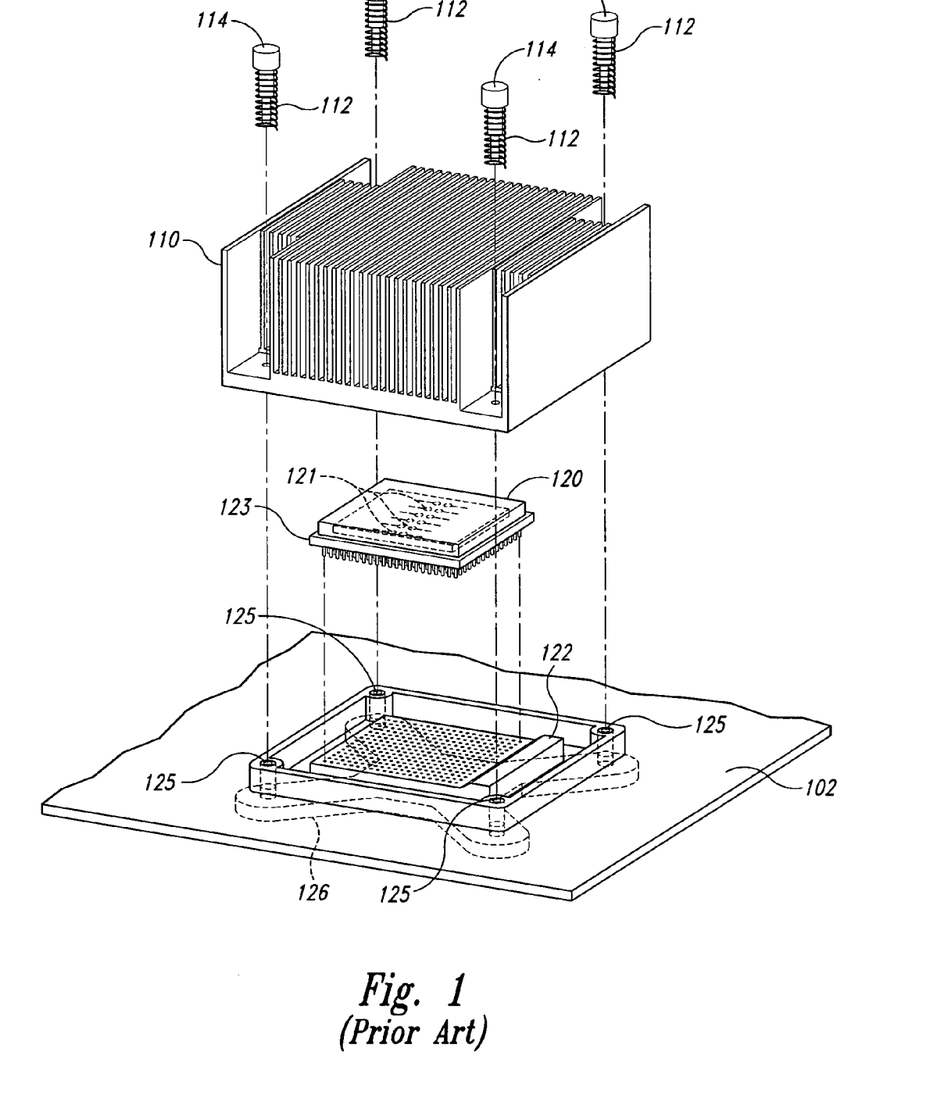
FIG. 1 is a partially exploded isometric view of a heat sink mounting arrangement configured in accordance with the prior art.

FIG. 1 is a partially exploded isometric view of a packaged microelectronic device 120 having a heat sink 110 configured in accordance with the prior art. A socket 122 electrically connects the microelectronic device 120 to electrical traces (not shown) on a motherboard 102. The heat sink 110 is held in contact with the microelectronic device 120 by a plurality of screws 114 which extend longitudinally through corresponding coil springs 112. The screws 114 engage threaded sockets 125 protruding from a backplate 126. Threading the screws 114 into the sockets 125 compresses the coil springs 112 against the heat sink 110 and presses the heat sink 110 against the microelectronic device 120 in a "controlled" manner that is intended to provide good thermal conductivity without damaging the microelectronic device 120.

In the prior art example described above, the microelectronic device 120 can represent any one of a number of different devices, such as fast processors, routers, etc., commonly referred to as "high performance devices." Such devices typically include a large number of electrical connections in a very small volume to prevent signal delays associated with distance. The microelectronic device 120, for example, includes a very fine pitch ball-grid array (BGA) 121 of very small solder balls electrically coupled to corresponding ball pads on a substrate 123. These electrical connections are delicate and susceptible to breakage or damage from stresses caused by the weight of the microelectronic device 120 and movements during shipping, installation, and use. These connections are also very susceptible to damage as a result of pressure exerted by the heat sink 110. As a result, manufacturers of such devices typically limit the pressure that can be applied to the device and the mass that can be attached to the device. Advanced Micro Devices, Inc., for example, specifies a pressure limit of 15 psi and a specified mass limit of 150 grams for certain processors.

One shortcoming of the spring-loaded mounting arrangement illustrated in FIG. 1 is that it can cause the heat sink 110 to exert a nonuniform pressure against the microelectronic device 120. The nonuniform pressure can result from a number of different factors, including spring adjustment, manufacturing tolerances, installation errors, etc. Nonuniform pressure is undesirable because it can cause one corner of the heat sink 110 to press against the microelectronic device 120 with a significantly greater pressure than the other corners. This pressure imbalance reduces the thermal conductivity in the low pressure corners. In addition, the pressure in the high pressure corner may exceed the limit set by the manufacturer, resulting in damage to the BGA 121 and/or degradation in device performance.

Another shortcoming of the heat sink mounting arrangement illustrated in FIG. 1 is that placement of the screws 114 requires cutting back some of the cooling fins. Further, the screws 114 and the coil springs 112 obstruct the flow of cooling air over and around the adjacent cooling fins. Consequently, the screws 114 and the coil springs 112 reduce the heat transfer capacity of the heat sink 110.

DETAILED DESCRIPTION

The following disclosure describes several embodiments of assemblies for holding heat sinks and other structures in contact with electronic devices and other apparatuses. Specific details of several embodiments of the invention are described below to provide a thorough understanding of such embodiments. Other details describing well-known structures and systems often associated with computers and related cooling devices, however, are not set forth below to avoid unnecessarily obscuring the description of the various embodiments. Those of ordinary skill in the art will understand that the invention may have other embodiments in addition to those described below. Such embodiments may lack one or more of the elements described below or may include elements other than those described below.

In the Figures, identical reference numbers identify identical or at least generally similar elements. To facilitate the discussion of any particular element, the most significant digit or digits of any reference number refer to the Figure in which that element is first introduced. Element 210, for example, is first introduced and discussed with reference to FIG. 2.

Figure 2:
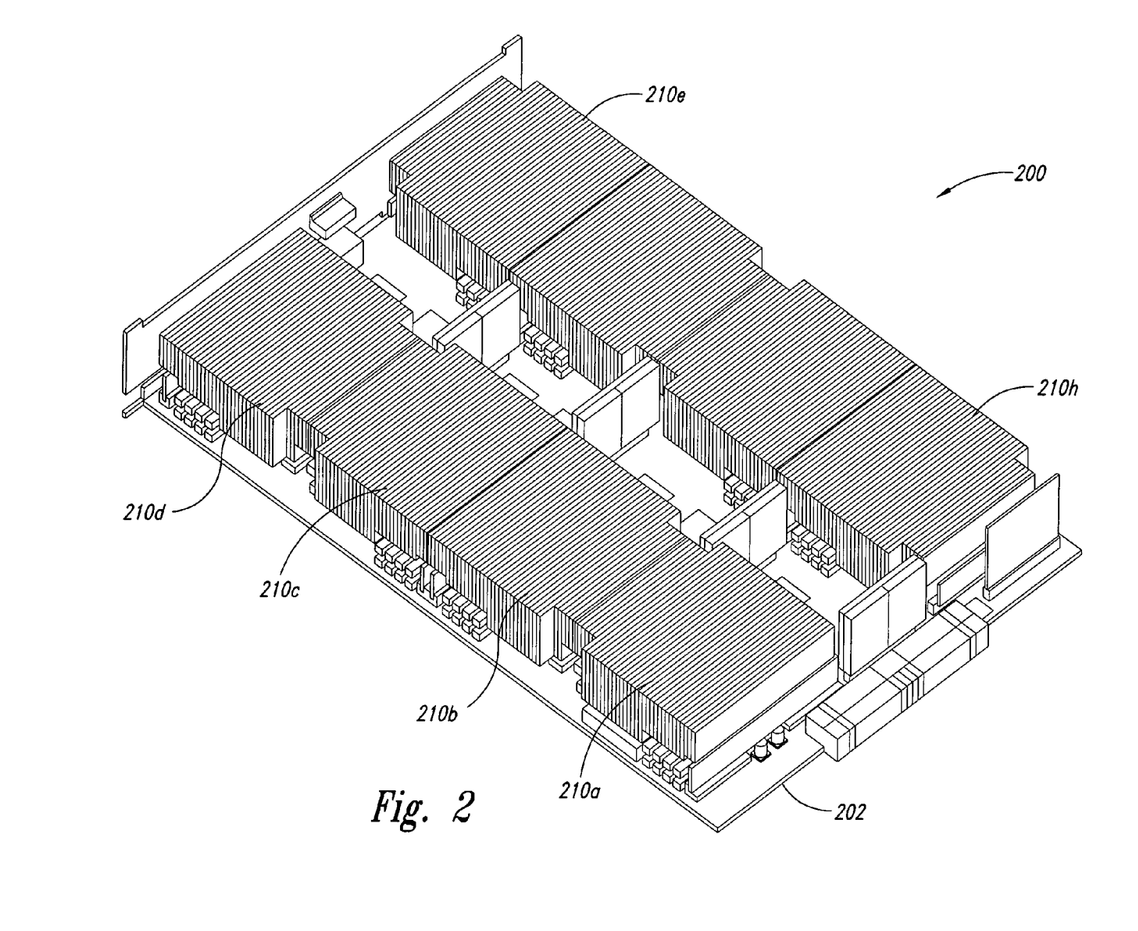
FIG. 2 is an isometric view of a computer module having a plurality of heat sinks configured in accordance with an embodiment of the invention.

FIG. 2 is an isometric view of a computer module 200 having a plurality of heat sinks 210 (identified individually as heat sinks 210a–h) configured in accordance with an embodiment of the invention. The computer module 200 can be of a type suitable for use in a super computer or other large computing system. As such, the computer module 200 can include a plurality of electronic devices, e.g., processors, routers, memory devices, etc. (not shown), mounted to a motherboard 202. The heat sinks 210 are held in contact with these devices to provide conductive cooling during operation.

Figure 3:
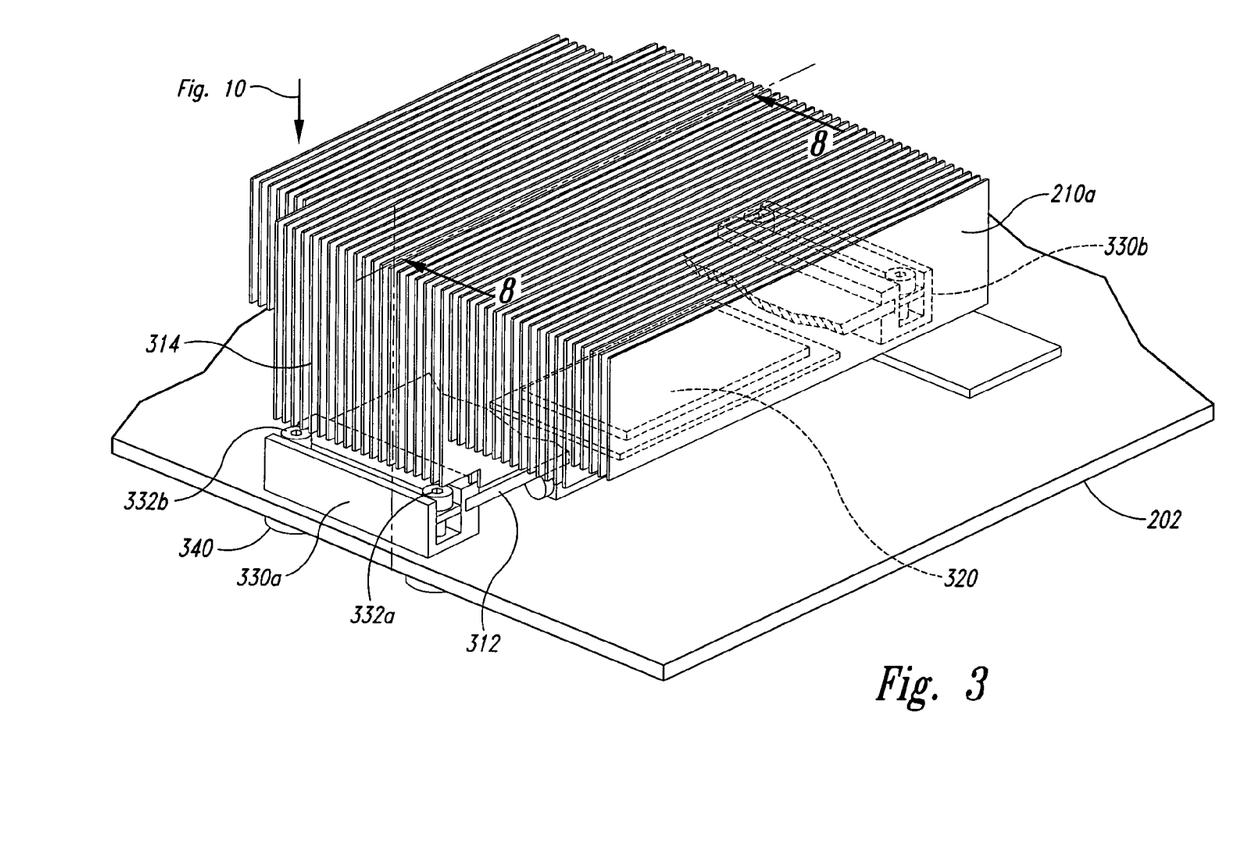
FIG. 3 is an enlarged isometric view of a heat sink mounting arrangement configured in accordance with an embodiment of the invention.

FIG. 3 is an enlarged isometric view the heat sink 210a of FIG. 2. The heat sink 210a includes a plurality of cooling fins 314 extending upwardly from a base portion 312. The base portion 312 is held in contact with an electronic device 320 by a first bracket assembly 330a and a second bracket assembly 330b. As described in greater detail below, the bracket assemblies 330 are attached to the motherboard 202 by fasteners 332 that extend through the motherboard 202 and engage a backplate 340.

Figure 4:
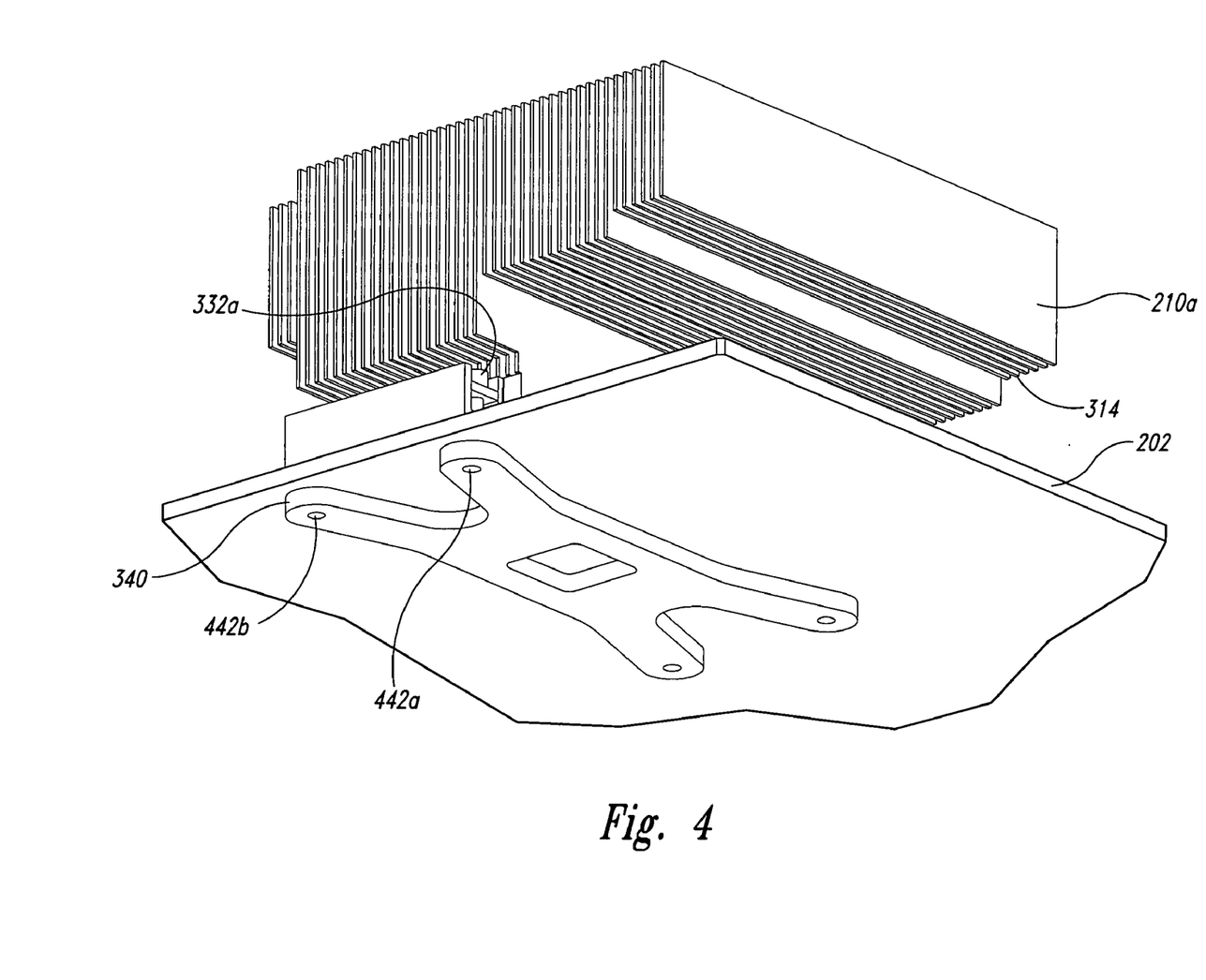
FIG. 4 is a bottom isometric view of the heat sink mounting arrangement of FIG. 3.

FIG. 4 is a bottom isometric view looking upwardly at the heat sink installation of FIG. 3. This view illustrates that the cooling fins 314 of the heat sink 210a can be formed and shaped as necessary to provide clearance around adjacent hardware (not shown) while still providing considerable surface area. This view further illustrates that the backplate 340 includes a plurality of threaded holes 442. The threaded holes 442 engage the fasteners 332 when the heat sink 210a is attached to the motherboard 202.

Figure 5:
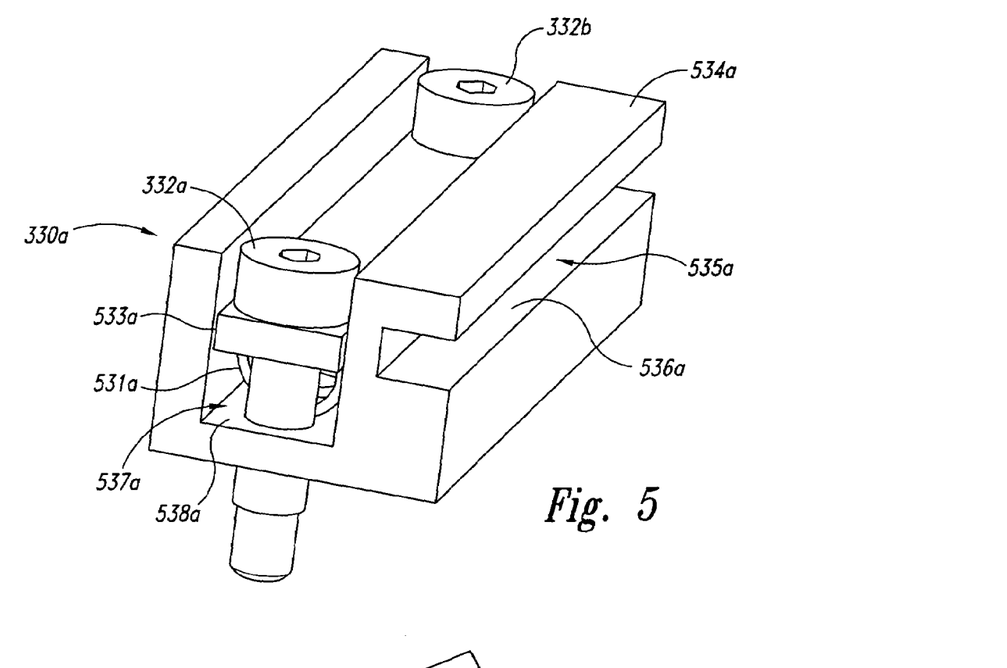
FIG. 5 is an enlarged isometric view of a heat sink mounting bracket configured in accordance with an embodiment of the invention.

FIG. 5 is an enlarged isometric view of the bracket assembly 330a configured in accordance with an embodiment of the invention. The bracket assembly 330a includes a body 534a having a spring holding portion 537a and a heat sink engagement portion 535a. In the illustrated embodiment, the heat sink engagement portion 535a includes a first elongate channel 536a configured to receive an edge portion of the heat sink 210a (FIGS. 2–4). The spring holding portion 537a includes a second elongate channel 538a configured to laterally support a coil spring 531a. The first and second fasteners 332a, b extend through a plate 533a that holds the coil spring 531a in the second channel 538a. As described in greater detail below, tightening the fasteners 332 into the backplate 340 (FIG. 4) causes the plate 533a to transversely compress the coil spring 531a against the second channel 538a.

In various embodiments, the body 534a and the plate 533a of the bracket assembly 330a can be machined or otherwise formed from aluminum having an anodized, dielectric surface finish. In other embodiments, these parts can be made from other metallic and/or non-metallic materials exhibiting suitable structural, thermal, and/or manufacturing characteristics.

Figure 6:
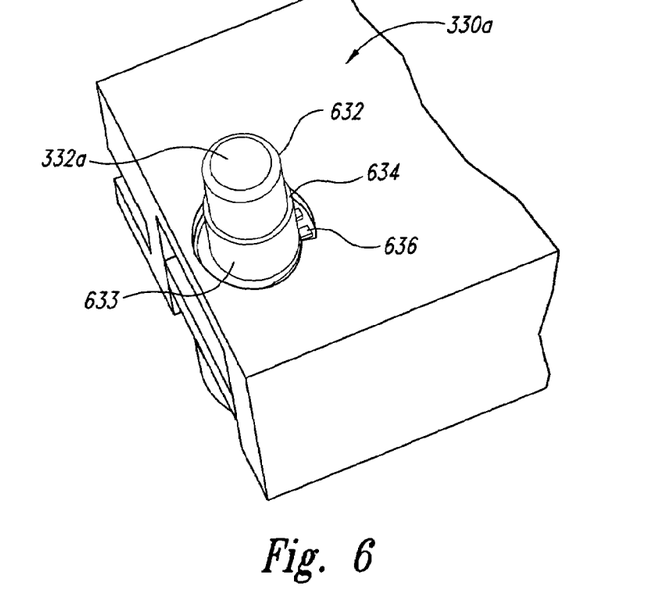
FIG. 6 is an enlarged bottom isometric view of a portion of the heat sink mounting bracket of FIG. 5.

FIG. 6 is an enlarged bottom isometric view of a portion of the bracket assembly 330a of FIG. 5. The fastener 332a extends through the body 534a and is held in place by a retaining device 636. In the illustrated embodiment, the retaining device 636 is a snap-ring, cir-clip, or similar device that fits into a groove in a shank 633 of the fastener 332a. Use of the retaining device 636 holds the components of the bracket assembly 330a together prior to installation.

The fastener 332a includes an externally threaded end portion 632 configured to engage the threaded holes 442 of the backplate 340 (FIG. 4). The fastener 332a further includes a shoulder 634 positioned between the threaded portion 632 and the shank 633. As described in greater detail below, the shoulder 634 is used to control the position of the bracket assembly 330a relative to the motherboard 202, and thereby control the amount of force exerted by the transversely compressed coil spring 351a against the electronic device 320 via the heat sink 210a (FIG. 3).

In one embodiment, the coil springs 531 can be made from steel, such as high-strength steel plated with a thermally efficient material, such as silver and/or copper. Steel has desirable properties, including low thermal/stress relaxation and high thermal conductivity. In addition, plating can enhance the thermal conductivity of the steel to facilitate heat transfer from the heat sink 210a to the bracket assembly 330a. In other embodiments, the coil springs 531 can be made from other metallic and non-metallic materials. In further embodiments, other elastically and/or compressible members can be used in place of the coil springs 531. Such materials can include, for example, compressible foam materials. In yet other embodiments, a gas or liquid bladder can be used to provide the uniform compression forces provided by the coil springs 531.

Figure 7:
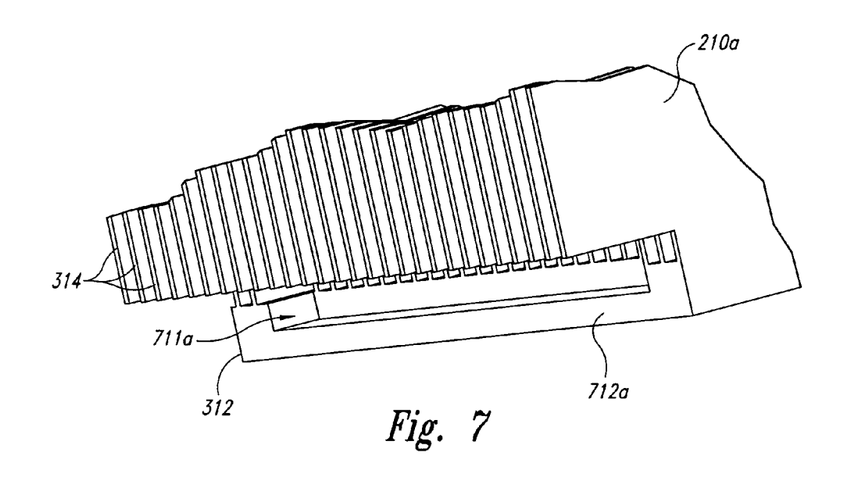
FIG. 7 is an enlarged isometric view of a portion of the heat sink shown in FIG. 3.

FIG. 7 is an enlarged isometric end view of the heat sink 210a of FIG. 3 illustrating a heat sink mounting feature 711a configured in accordance with an embodiment of the invention. In the illustrated embodiment, the heat sink mounting feature 711a includes an outer edge 712a of the base portion 312. As described in greater detail below, the outer edge 712a is configured to be received by the heat sink engagement portion 535a of the bracket assembly 330a (FIG. 5).

Figure 8:
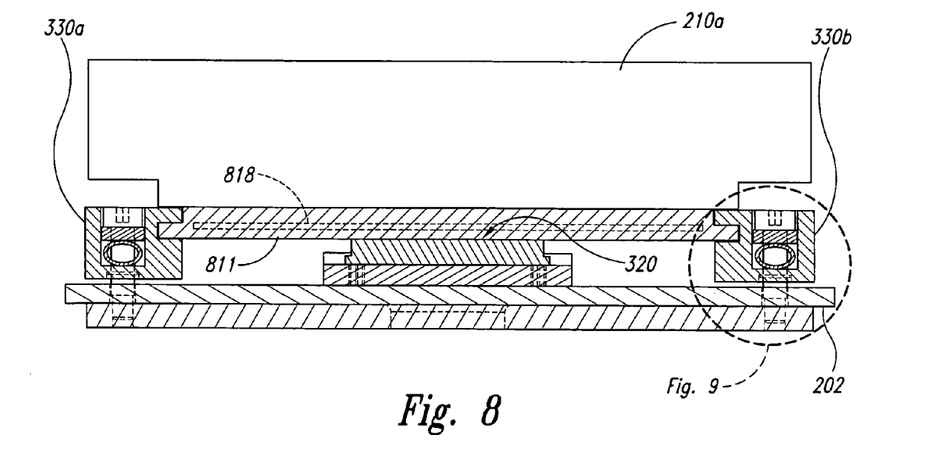
FIG. 8 is a side cross-sectional view of the heat sink mounting arrangement of FIG. 3.

FIG. 8 is a side cross-sectional view of the heat sink mounting arrangement of FIG. 3 taken substantially along line 8—8 in FIG. 3. The electronic device 320 is mounted to the motherboard 202. The first bracket assembly 330a and the second bracket assembly 330b hold a bottom surface 811 of the heat sink 210a against the electronic device 320 to provide conductive cooling during operation, as described in greater detail below with reference to FIG. 9.

Figure 9:
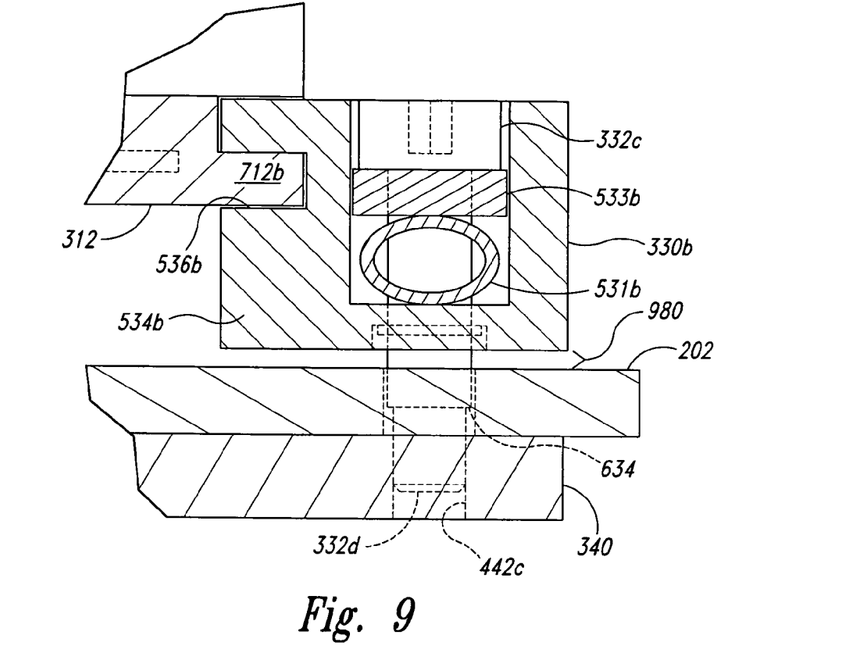
FIG. 9 is an enlarged cross-sectional view of a portion of the heat sink mounting arrangement of FIG. 3, taken from FIG. 8.

FIG. 9 is an enlarged cross-sectional view of the second bracket assembly 330b taken from FIG. 8. The outer edge 712b of the heat sink base portion 312 is received by the elongate channel 536b in the body 534b of the bracket assembly 330b. The fastener 332c extends through the plate 533b, the body 534b, and the motherboard 202 and engages the threaded hole 442c on the backplate 340. The fastener 332c is tightened until the shoulder 634 of the fastener butts against the backplate 340, leaving a gap 980 between the bracket assembly 330b and the motherboard 202. In this manner, the location of the shoulder 634 limits the transverse compression of the coil spring 531b and, thereby, sets the pressure exerted by the heat sink 210a against the electronic device 320 (FIG. 8).

An advantage of the embodiment illustrated in FIGS. 8 and 9 is that the transversely compressed coil springs 531 cause the heat sink 210a to exert a uniform, or an at least approximately uniform, pressure against the electronic device 320. This uniform pressure enables the heat sink 210a to efficiently transfer heat away from the electronic device 320 without damaging the ball-grid arrays (not shown) or other features of the electronic device 320. Another advantage of this embodiment is that the fasteners 332 do not extend through the base portion 312 of the heat sink 210a. As a result, the base portion 312 can be configured as a vapor chamber or heat pipe 818 (FIG. 8) to provide greater cooling properties than a heat sink having a solid base portion. A further advantage of this embodiment is that the fasteners 332 can be installed through the bracket assemblies 330 before the heat sink 210a is engaged with the bracket assemblies 330. As a result, the heat sink cooling fins 314 do not have to be cut back around the fasteners to provide clearance for fastener installation. In contrast, the cooling fins of the prior art heat sink 110 illustrated in FIG. 1 are cut back in the region directly adjacent to the mounting screws.

Figure 10:
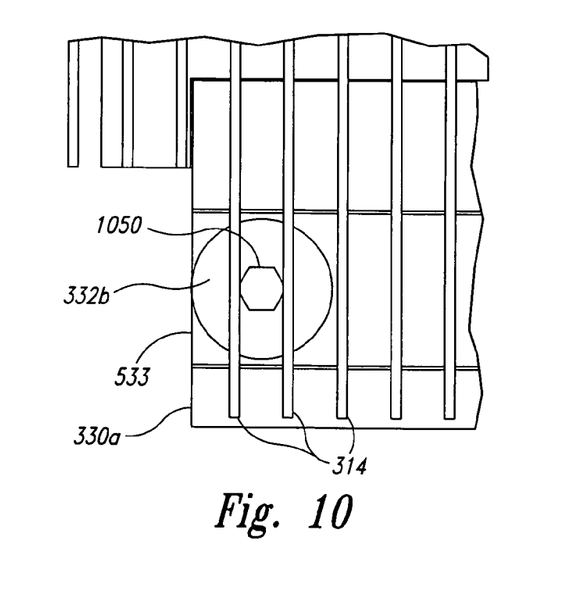
FIG. 10 is an enlarged top view of a portion of the heat sink mounting arrangement of FIG. 3.

FIG. 10 is a top view of the heat sink mounting arrangement of FIG. 3 taken substantially along line 10 in FIG. 3. The fastener 332b includes a tool engagement feature 1050 configured to receive a tool (not shown) for engaging the fastener 332b with the threaded hole 442 in the backplate 340 (FIG. 9). In the illustrated embodiment, the tool engagement feature 1050 is a hexagonal hole configured to receive an end portion of an Allen wrench. The hexagonal hole is sized to fit between adjacent cooling fins 314 so that the Allen wrench can be inserted between the cooling fins 314 during fastener installation. This feature enables the cooling fins 314 to overhang the bracket assembly 330a, thereby increasing surface area for cooling.

Figure 11:
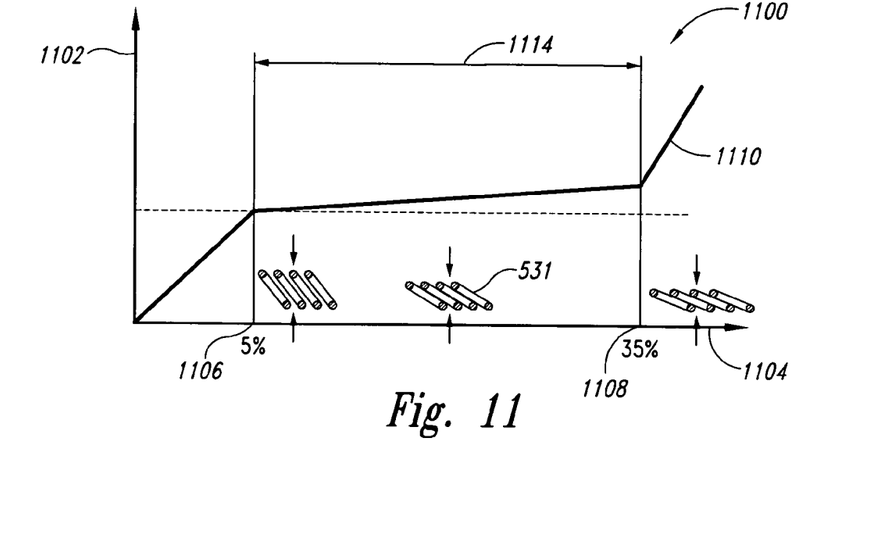
FIG. 11 is a diagram illustrating a graph of spring force versus transverse compression for a canted coil spring in accordance with an embodiment of the invention.

FIG. 11 is a diagram illustrating a graph 1100 of force versus transverse compression for a canted coil spring, such as the coil springs 531 of the present invention. Force is measured along a vertical axis 1102, and transverse compression as a percentage of uncompressed spring diameter is measured along a horizontal axis 1104. As a plot 1110 illustrates, the compression force increases only gradually in a working range 1114 between an initial working compression 1106 and a maximum working compression 1108. In one embodiment, the initial working compression 1106 can correspond to a transverse spring compression of about three to 10 percent (e.g., about five percent), and the maximum working compression 1108 can correspond to a transverse compression of about 25 to 50 percent (e.g., about 35 percent).

As the graph 1100 illustrates, one advantage of using coil springs in transverse compression is that they provide approximately constant compression force in the working range 1114. This feature allows the coil springs 531 to be selected so that they are compressed to approximately the middle of the working range 1114 (e.g., about 20 to 25 percent) when the heat sink 210 is pressing against the electronic device 320 under normal operating conditions (see, for example, FIG. 3). For example, when the shoulders 634 of the fasteners 332 butt against the backplate 340, the compression in the canted coil springs 531 is desirably approximately in the middle of the working range 1114. In this way, minor variations in spring compression as a result of manufacturing tolerances, assembly errors, and other factors will not cause the spring force to change appreciably. As a result, the force with which the heat sink 210 presses against the electronic device 320 will remain fairly uniform, thereby avoiding damage to the electronic device 320 while providing consistent, efficient heat transfer.

Figure 12:
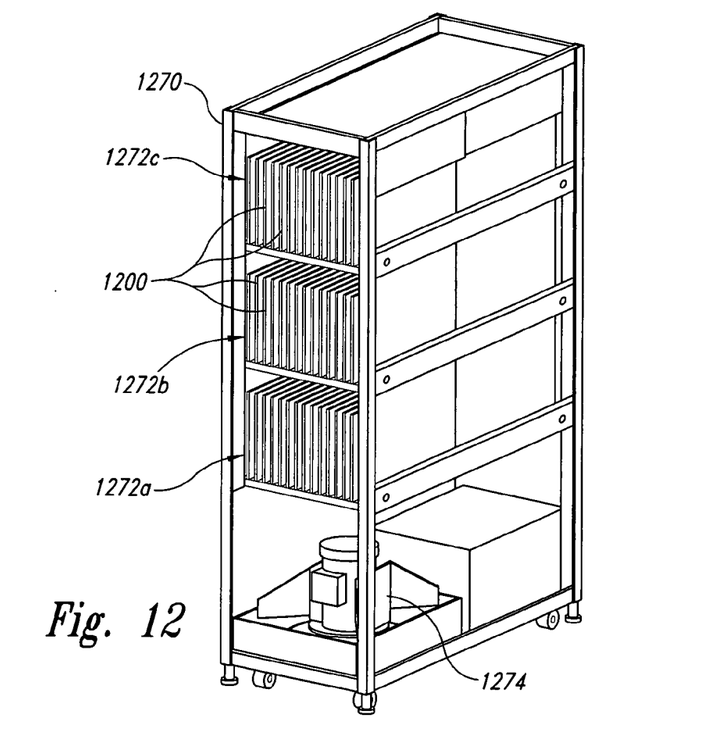
FIG. 12 is an isometric view of a computer cabinet holding a plurality of computer modules configured in accordance with an embodiment of the invention.

FIG. 12 is an isometric top view of a computer cabinet 1270 configured in accordance with an embodiment of the invention. Exterior panels have been removed from the computer cabinet 1270 for purposes of clarity. In one aspect of this embodiment, the computer cabinet 1270 can be one of a plurality of computer cabinets forming a supercomputer system. The computer cabinet 1270 can include a plurality of computer module holding portions 1272 (identified individually as a first module holding portion 1272a, a second module holding portion 1272b, and a third module holding portion 1272c). Each of the module holding portions 1272 can carry a plurality of computer modules 1200 positioned in edgewise orientation in close proximity to each other. In one aspect of this embodiment, one or more of the computer modules 1200 can be at least generally similar in structure and function to the computer module 200 described above with reference to FIG. 2.

In the illustrated embodiment, the computer cabinet 1270 includes an air mover 1274 (e.g., a fan) positioned below the module holding portions 1272. The air mover 1274 can move cooling air from a floor plenum (not shown) past the plurality of computer modules 1200 to cool the various electronic devices mounted to the associated motherboards. The cooling air can be exhausted through an air outlet (not shown) positioned toward an upper portion of the computer cabinet 1270.

Figure 13A:
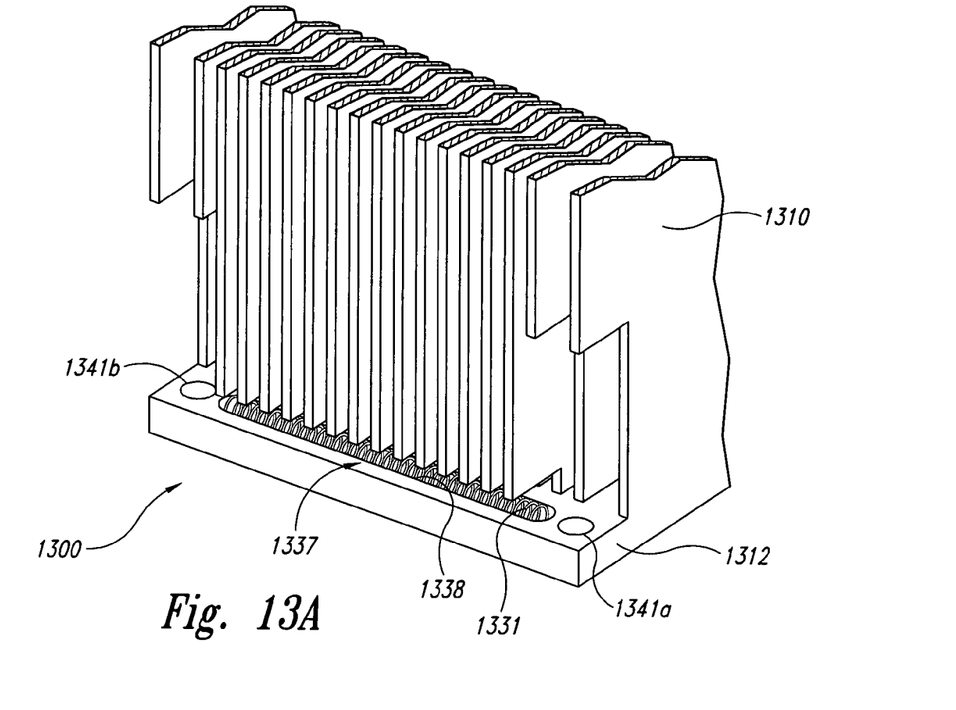
FIG. 13A is an isometric view of a partially-assembled heat sink assembly configured in accordance with another embodiment of the invention.
Figure 13B:
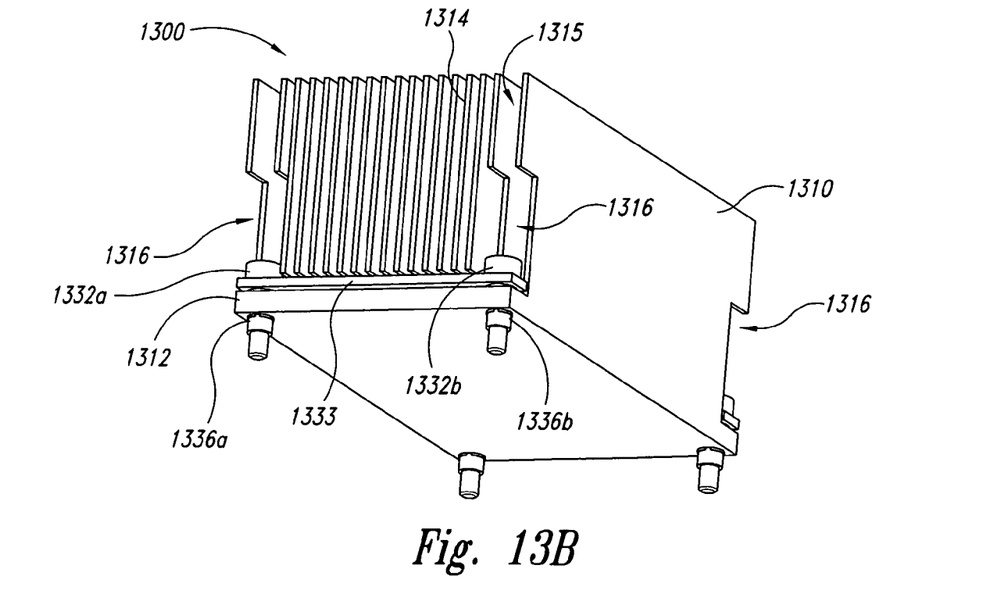
FIG. 13B is a bottom isometric view of the heat sink assembly of FIG. 13A when fully assembled.

FIG. 13A is an isometric view of a partially-assembled heat sink assembly 1300 configured in accordance with another embodiment of the invention, and FIG. 13B is a bottom isometric view of the heat sink assembly 1300 when fully assembled. Referring to FIGS. 13A and 13B together, the heat sink assembly 1300 includes a heat sink 1310 that is at least generally similar in structure and function to the heat sink 210 described above with reference to FIGS. 3 and 4. In one aspect of this particular embodiment, however, the heat sink 1310 includes a base portion 1312 having an integral spring holding portion 1337. This spring holding portion 1337 includes an elongate channel configured to laterally support a coil spring 1331. A first fastener hole 1341a and a second fastener hole 1341b extend through the base portion 1312 at opposite ends of the elongate channel 1338.

As shown in FIG. 13B, the heat sink assembly 1300 further includes an elongate plate 1333 positioned to hold the coil spring 1331 in the elongate channel 1338. First and second fasteners 1332a and 1332b extend through the plate 1333 and the corresponding first and second holes 1341a and 1341b in the base portion 1312. The fasteners 1332 are held in place by corresponding first and second retaining devices 1336a and 1336b.

The heat sink 1310 includes a plurality of cooling fins 1314 extending upwardly from the base portion 1312. The cooling fins 1314 can include cutaways 1316 configured to accommodate installation of the fasteners 1332. In addition, as described in greater detail below, the cooling fins 1314 can further include tool slots 1315 configured to accommodate passage of a suitable tool (e.g., an Allen wrench) for installing the fasteners 1332 into a back plate for mounting the heat sink assembly 1300 to an electronic device (not shown) on a motherboard (also not shown).

Figure 14:
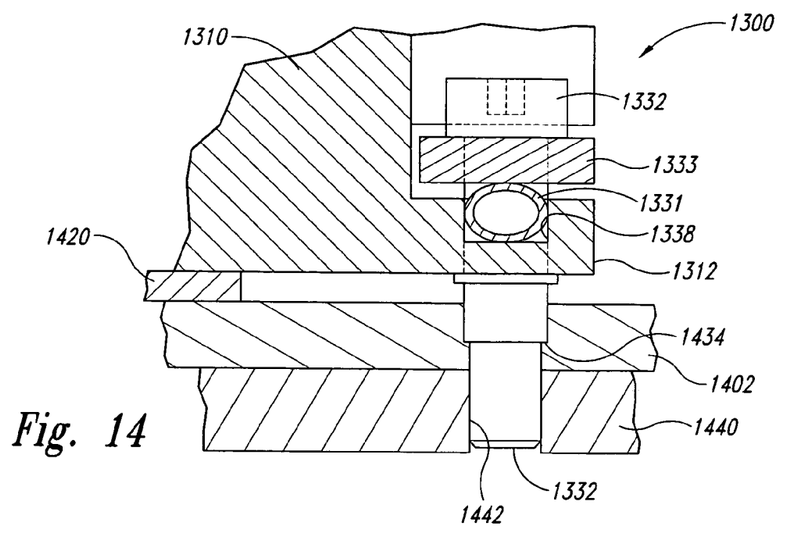
FIG. 14 is an enlarged cross-sectional view of a portion of the heat sink assembly of FIGS. 13A and 13B in which the heat sink assembly is mounted to a motherboard in accordance a further embodiment of the invention.

FIG. 14 is an enlarged cross-sectional view of a portion of the heat sink assembly 1300 in which the heat sink assembly 1300 is mounted to a motherboard 1402 in accordance with an embodiment of the invention. The coil spring 1331 is positioned in the elongate channel 1338 on the heat sink base portion 1312. The plate 1333 is positioned over the coil spring 1338, and the fasteners 1332 are installed through the plate 1333 and the motherboard 1402. The fasteners 1332 are then engaged with corresponding threaded holes 1442 in a back plate 1440. As the fasteners 1332 are threaded into the back plate 1440, the base portion 1312 of the heat sink 1310 is brought into surface-to-surface contact with an electronic device 1420. The fasteners 1332 are tightened until a shoulder 1434 on each of the fasteners 1332 butts against a corresponding shoulder on the motherboard 1402. In this configuration, the coil spring 1331 is canted slightly and transversely compressed so that the heat sink 1310 exerts a controlled pressure against the electronic device 1420.

One feature of the embodiments described above with reference to FIGS. 13A, 13B and 14 is that the coil spring 1331 and associated mounting hardware is carried by the heat sink base portion 1312. One advantage of this feature is that it eliminates the need for separate bracket assemblies (such as the bracket assemblies 330 of FIG. 5) to mount the heat sink 1310 to a motherboard. As a result, this embodiment reduces part count.

Figure 15A:
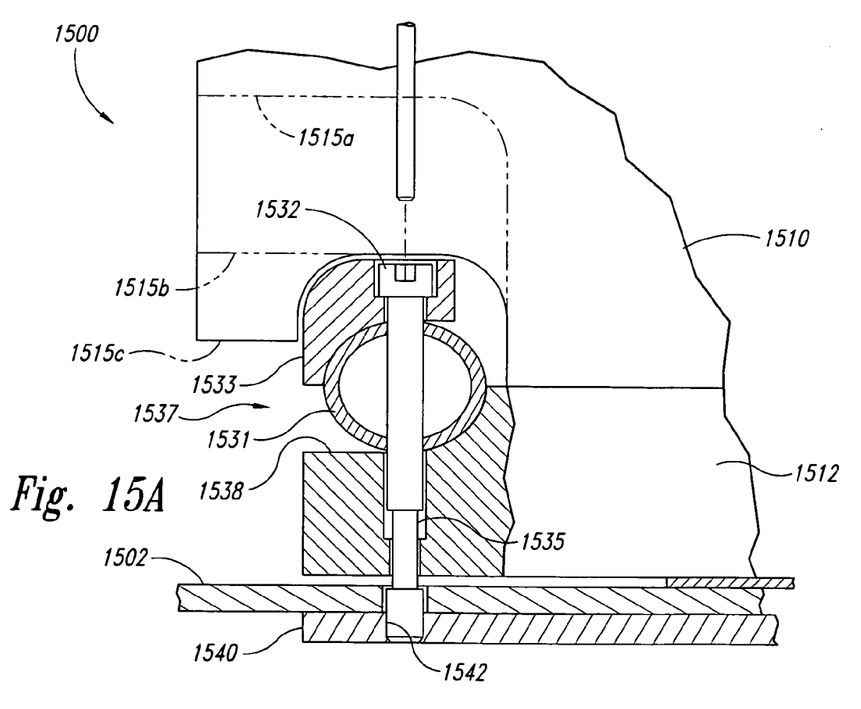
FIG. 15A is a cross-sectional view of a heat sink assembly configured in accordance with yet another embodiment of the invention.
Figure 15B:
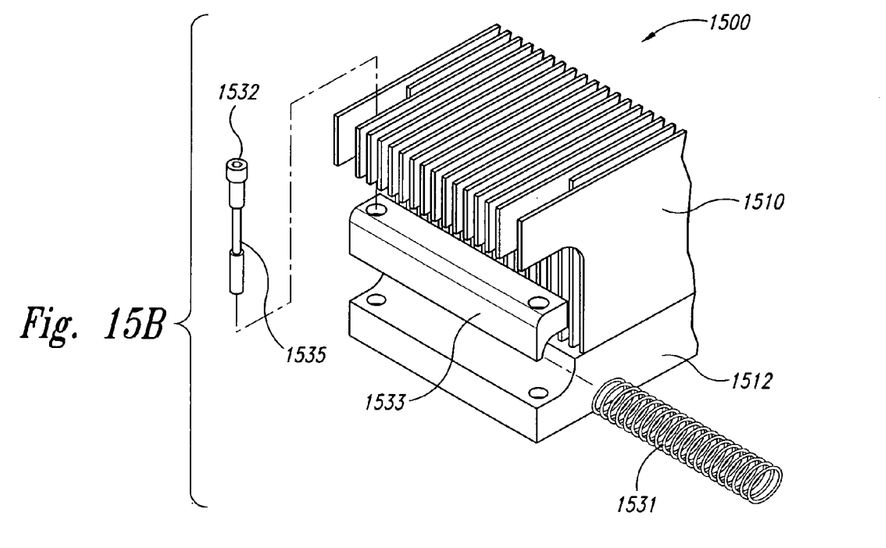
FIG. 15B is an exploded isometric view of a portion of the heat sink assembly of FIG. 15A.

FIG. 15A is a partial cross-sectional view of a heat sink assembly 1500 configured in accordance with a further embodiment of the invention, and FIG. 15B is an exploded isometric view of a portion of the heat sink assembly 1500. Referring to FIGS. 15A and 15B together, many features of the heat sink 1500 are at least generally similar in structure and function to corresponding features of the heat sink 1300 described above with reference to FIGS. 13A, 13B and 14. In this particular embodiment, however, the heat sink assembly 1500 includes a heat sink 1510 with a spring holding portion 1537 that includes a contoured surface 1538. The heat sink assembly 1500 further includes a contoured plate 1533 that cooperates with the contoured surface 1538 to hold a coil spring 1531 in transverse compression. This particular spring holding configuration may have certain advantages over the configuration described above with reference to FIGS. 13A, 13B and 14 from the standpoint of accessibility for spring installation and removal.

A fastener 1532 extends through the contoured plate 1533, the heat sink base portion 1512, and a motherboard 1502, and engages a threaded hole 1542 in a back plate 1540. The fastener 1532 includes a necked-down portion 1535 that allows the heat sink 1510 to float somewhat laterally during installation and use to accommodate positional misalignment, thermal expansion/contraction, etc.

In one aspect of this embodiment, the heat sink 1510 can include cooling fins 1514 that are cut back to a first line 1515a to permit installation of the fastener 1532. Away from the fastener 1532, the cooling fins 1514 can be cut back less dramatically to a second line 1515b. Alternatively, the cooling fins 1514 away from the fastener 1532 can be extended to a third line 1515c if maximum cooling fin area is desired.

Figure 16:
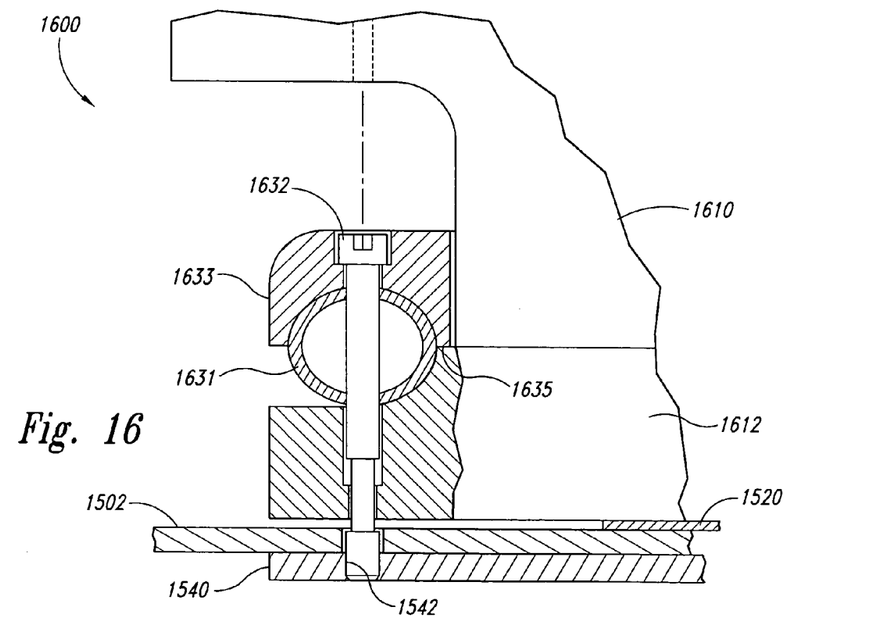
FIG. 16 is a cross-sectional view of a portion of a heat sink assembly configured in accordance with a further embodiment of the invention.

FIG. 16 is a cross-sectional view of a heat sink assembly 1600 configured in accordance with yet another embodiment of the invention. The heat sink assembly 1600 includes many features that are at least generally similar in structure and function to corresponding features of the heat sink 1500 described above with reference to FIGS. 15A and 15B. In one aspect of this particular embodiment, however, the contoured plate 1633 can include a hard-stop portion 1635. The hard-stop portion 1635 can be configured to butt against a base portion 1612 of a heat sink 1610 when a fastener 1632 is fully installed. One advantage of this feature is that it can be used to control the transverse compression of the canted coil spring 1631.

From the foregoing, it will be appreciated that specific embodiments of the invention have been described herein for purposes of illustration, but that various modifications may be made without deviating from the spirit and scope of the invention. Accordingly, the invention is not limited, except as by the appended claims.

I claim:

1. A structure for holding a heat sink in contact with an electronic device, the structure comprising:
   a heat sink engagement portion configured to engage part of the heat sink; and
   a spring holding portion positioned adjacent to the heat sink engagement portion, wherein the spring holding portion is configured to transversely support a coil spring, and wherein installation of a fastener through an aperture in the structure positioned at least proximate to the spring holding portion transversely compresses the coil spring, thereby biasing the heat sink against a surface of the electronic device.

2. The structure of claim 1 wherein the spring holding portion includes an elongate recess configured to transversely support the coil spring.

3. The structure of claim 1 wherein the spring holding portion includes an elongate recess configured to transversely support the coil spring, wherein the elongate recess includes a first wall portion, a second wall portion opposite the first wall, and a bottom wall portion connecting the first and second wall portions, and wherein the aperture is positioned between the first and second wall portions.

4. The structure of claim 1 wherein the aperture is a first aperture positioned toward one end of the spring holding portion, and wherein the structure further includes a second aperture positioned toward a second end of the spring holding portion, further wherein installation of a second fastener through the second aperture transversely compresses the coil spring, thereby biasing the heat sink against a surface of the electronic device.

5. The structure of claim 1 wherein the heat sink engagement portion includes a groove configured to receive an edge of the heat sink.

6. The structure of claim 1:
wherein the heat sink engagement portion includes a groove configured to receive an edge of the heat sink;
wherein the spring holding portion includes an elongate recess configured to transversely support the coil spring, wherein the elongate recess includes a first wall portion, a second wall portion opposite the first wall, and a bottom wall portion connecting the first and second wall portions; and
wherein the aperture is a first aperture positioned toward one end of the spring holding portion between the first and second wall portions, and wherein the structure further includes a second aperture positioned toward a second end of the spring holding portion between the first and second wall portions, further wherein installation of a second fastener through the second aperture transversely compresses the coil spring, thereby biasing the heat sink against a surface of the electronic device.

7. An apparatus for cooling an electronic device positioned on a substrate, the apparatus comprising:
a heat sink portion configured to contact a surface of the electronic device and dissipate heat generated by the electronic device;
a fastening portion extending from the heat sink portion and configured to receive at least one fastener for attaching the apparatus to the substrate; and
a spring holding portion positioned adjacent to the fastening portion and configured to support a coil spring in transverse compression, whereby the coil spring exerts a transverse compression force biasing the heat sink portion against the surface of the electronic device when the at least one fastener attaches the apparatus to the substrate.

8. The apparatus of claim 7 wherein the heat sink portion includes a plurality of fins extending from a contact surface, and wherein the contact surface is at least approximately flat.

9. The apparatus of claim 7 wherein the fastening portion includes a plurality of fastening apertures configured to receive a corresponding plurality of fasteners for attaching the apparatus to the substrate.

10. The apparatus of claim 7 wherein the spring holding portion includes a recess configured to transversely support the coil spring, and wherein the recess includes a curved surface portion.

11. The apparatus of claim 7, further comprising a plate, wherein the fastening portion includes at least a first fastener aperture and the plate includes a second fastener aperture, and wherein the first and second fastener apertures are configured to receive a fastener for attaching the apparatus to the substrate and transversely compressing the coil spring between the plate and the spring holding portion.

12. An assembly for holding a heat sink in contact with an electronic device on a substrate, the assembly comprising:
a bracket having:
a heat sink engagement portion configured to support a portion of the heat sink;
a spring holding portion positioned adjacent to the heat sink engagement portion;
a coil spring positioned laterally in the spring holding portion of the bracket; and
a fastener extending through an aperture positioned at least proximate to the spring holding portion of the bracket, wherein the coil spring is configured to exert a transverse compression force pressing the heat sink against a surface of the electronic device when the fastener is coupled to the substrate.

13. The assembly of claim 12 wherein the spring holding portion includes a recess configured to transversely support the coil spring.

14. The assembly of claim 12 wherein the spring holding portion includes a recess configured to transversely support the coil spring, wherein the recess includes a first wall portion, a second wall portion opposite the first wall portion, and a bottom wall portion connecting the first and second wall portions, and wherein the fastener aperture is positioned between the first and second wall potions.

15. The assembly of claim 12 wherein the fastener is a first fastener, wherein the aperture is a first aperture, and wherein the assembly further includes a second aperture spaced apart from the first aperture, wherein the coil spring is transversely supported between the first and second fasteners when the first fastener is installed through the first aperture and the second fastener is installed through the second aperture.

16. The assembly of claim 12 wherein the aperture is a first aperture and the assembly further comprises a plate having a second aperture, wherein the coil spring is transversely compressed between the plate and the spring holding portion upon installation of the fastener through the first and second apertures.

17. The assembly of claim 12 wherein aperture is a first aperture and the assembly further comprises a plate having a second aperture, wherein the plate has a first curved surface portion configured to bear against one side of the coil spring, and the spring holding portion has a second curved surface portion configured to bear against the opposite side of the coil spring, wherein the coil spring is transversely compressed between the first curved surface portion of the plate and the second curved surface portion of the spring holding portion upon installation of the fastener through the first and second apertures.

18. A computer system, comprising:
a substrate carrying an electronic device;
a first bracket assembly attached to the substrate by at least one fastener, the first bracket assembly including a first coil spring; and
a heat sink engaged with the first bracket assembly, wherein the first coil spring exerts a transverse compression force pressing the heat sink against a surface of the electronic device.

19. The computer system of claim 18 wherein the first bracket assembly is engaged with a first end portion of the heat sink, and wherein the system further comprising a second bracket assembly attached to the substrate and engaged with a second end portion of the heat sink, the second bracket assembly including a second coil spring, wherein the second coil spring exerts a transverse compression force pressing the heat sink against the surface of the electronic device.

20. The computer system of claim 18 wherein the heat sink includes a contact surface configured to press against the surface of the electronic device and a plurality of fins projecting away from the contact surface.

21. The computer system of claim 18, further comprising:
a computer cabinet;
a first computer module compartment positioned within the computer cabinet and configured to hold at least a first computer module; and a second computer module compartment positioned within the computer cabinet in vertical alignment with the first computer module compartment, wherein the second computer module compartment is configured to hold at least a second computer module, and wherein the substrate is attached to the second computer module.

22. The computer system of claim 18 wherein the heat sink includes a plurality of cooling fins projecting away from the electronic device, and wherein the computer system further comprises:
 a computer cabinet;
 a first computer module compartment positioned within the computer cabinet and configured to hold at least a first computer module;
 a second computer module compartment positioned within the computer cabinet in vertical alignment with the first computer module compartment, wherein the second computer module compartment is configured to hold at least a second computer module, and wherein the substrate is attached to the second computer module; and
 an air mover operatively associated with the cabinet and configured to move cooling air through the cabinet and past the cooling fins on the heat sink to cool the electronic device.

23. A method for cooling an electronic device on a substrate, the method comprising:
 positioning a heat sink in contact with a surface of the electronic device; and
 pressing the heat sink against the surface of the electronic device by transversely compressing a coil spring against at least one of a portion of the heat sink and a bracket assembly attached to the heat sink.

24. The method of claim 23 wherein transversely compressing the coil spring includes canting a plurality of helical coils of the coil spring.

25. The method of claim 23, further comprising:
 engaging the heat sink with the bracket assembly;
 installing the coil spring on the bracket assembly; and
 fastening the bracket assembly to the substrate to position the heat sink in contact with the surface of the electronic device.

26. The method of claim 25 wherein engaging the heat sink with the bracket assembly includes inserting an edge of the heat sink into a recess of the bracket assembly.

27. The method of claim 25 installing the coil spring on the bracket assembly includes positioning the coil spring transversely in an elongate recess.

28. The method of claim 25 wherein fastening the bracket assembly to the substrate includes installing at least one fastener between the bracket assembly and the substrate to transversely compress the coil spring.

29. The method of claim 25, wherein the coil spring is a first coil spring on a first bracket assembly, and wherein pressing the heat sink against the electronic device includes transversely compressing the first coil spring against a first end portion of the heat sink and transversely compressing a second coil spring on a second bracket assembly against a second end portion of the heat sink, wherein the second end portion of the heat sink is opposite the first end portion.

* * * * *